(12) United States Patent
Anders et al.

(10) Patent No.: US 8,568,572 B2
(45) Date of Patent: Oct. 29, 2013

(54) VERY LOW PRESSURE HIGH POWER IMPULSE TRIGGERED MAGNETRON SPUTTERING

(75) Inventors: Andre Anders, El Cerrito, CA (US); Joakim Andersson, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 367 days.

(21) Appl. No.: 12/797,829

(22) Filed: Jun. 10, 2010

(65) Prior Publication Data

US 2010/0264016 A1 Oct. 21, 2010

Related U.S. Application Data

(63) Continuation-in-part of application No. PCT/US2008/086543, filed on Dec. 12, 2008.

(60) Provisional application No. 61/013,725, filed on Dec. 14, 2007, provisional application No. 61/014,315, filed on Dec. 17, 2007.

(51) Int. Cl.
*C23C 14/00* (2006.01)
*C23C 14/32* (2006.01)
*C23C 4/00* (2006.01)
*C25B 9/00* (2006.01)
*C25B 11/00* (2006.01)
*C25B 13/00* (2006.01)
*B05D 1/08* (2006.01)
*B05D 3/14* (2006.01)
*H05H 1/26* (2006.01)

(52) U.S. Cl.
USPC ............ 204/192.12; 204/192.38; 204/298.01; 204/298.41; 427/446; 427/562; 427/564

(58) Field of Classification Search
USPC ............ 204/192.12, 192.38, 298.02, 298.41; 427/446, 562, 564
See application file for complete search history.

(56) References Cited

U.S. PATENT DOCUMENTS 4,877,505 A * 10/1989 Bergmann ............... 204/192.38
5,234,561 A   8/1993 Randhawa et al.
(Continued)

FOREIGN PATENT DOCUMENTS

WO  WO 2005089272 A2 *  9/2005
WO     2007129021 A1   11/2007

OTHER PUBLICATIONS

Posadowski, "Sustained self sputtering of different materials using dc magnetron", Vacuum, vol. 46, No. 8-10, pp. 1017-1020, (Aug.-Nov. 1995).

(Continued)

*Primary Examiner* — Michael Band
(74) *Attorney, Agent, or Firm* — Lawrence Berkeley National Laboratory

(57) ABSTRACT

A method and apparatus are described for very low pressure high powered magnetron sputtering of a coating onto a substrate. By the method of this invention, both substrate and coating target material are placed into an evacuable chamber, and the chamber pumped to vacuum. Thereafter a series of high impulse voltage pulses are applied to the target. Nearly simultaneously with each pulse, in one embodiment, a small cathodic arc source of the same material as the target is pulsed, triggering a plasma plume proximate to the surface of the target to thereby initiate the magnetron sputtering process. In another embodiment the plasma plume is generated using a pulsed laser aimed to strike an ablation target material positioned near the magnetron target surface.

12 Claims, 5 Drawing Sheets

(56) References Cited

U.S. PATENT DOCUMENTS

| | | | |
|---|---|---|---|
| 5,702,573 | A | 12/1997 | Biberger et al. |
| 7,230,258 | B2 | 6/2007 | Ruzic et al. |
| 7,258,912 | B2* | 8/2007 | Yamamoto et al. ........... 428/216 |
| 2005/0051424 | A1* | 3/2005 | Fu et al. .................... 204/192.15 |
| 2005/0092596 | A1 | 5/2005 | Kouznetsov |
| 2005/0247554 | A1 | 11/2005 | Saigal et al. |
| 2007/0000770 | A1* | 1/2007 | Yamamoto ................. 204/192.1 |
| 2011/0089024 | A1 | 4/2011 | Anders |

OTHER PUBLICATIONS

Anders et al., "Efficient compact power supply for repetitively pulsed, "triggerless" cathodic arcs", Review of Scientific Instruments, vol. 70, No. 12, pp. 4532-4535, (Dec. 1999).

Anders et al., "Fundamentals of pulsed plasmas for materials processing", Surface and Coatings Technology, vol. 183, No. 2-3, pp. 301-311, (May 24, 2004).

MacGill et al., "Streaming metal plasma generation by vacuum arc plasma guns", Review of Scientific Instruments, vol. 69, No. 2, pp. 801-803, (Feb. 1998).

Anders, "Approaches to rid cathodic arc plasmas of macro- and nanoparticles: a review", Surface and Coatings Technology, vol. 120-121, No. , pp. 319-330, (Nov. 1999).

Anders and Yushkov, "Plasma "anti-assistance" and "self-assistance" to high power impulse magnetron sputtering", Journal of Applied Physics, vol. 105, 7, pp. 073301-1-073301-6, (2009).

Andersson and Anders "Self-Sputtering Far above the Runaway Threshold: An Extraordinary Metal-Ion Generator", Physical Review Letters, vol. 102, No. 4, pp. 045003-1-045003-4, (Jan. 30, 2009).

Oaks and Anders, "Evolution of the plasma composition of a high power impulse magnetron sputtering system studied with a time-of-flight spectrometer", Journal of Applied Physics; vol. 105, No. 9, pp. 093304-1-093304-9, (2009).

Ehiasarian et al., "Influence of high power densities on the composition of pulsed magnetron plasmas", Vacuum, vol. 65, No. 2, pp. 147-154, (Apr. 19, 2002).

Preuss, "A Supercharged Metal-Ion Generator", Berkeley Lab News Center, (Jan. 28, 2009).

Chistyakov et al., "Advances in High Power Pulse Reactive Magnetron Sputtering", 49th Annual Technical Conference Proceedings, pp. 88-91, 2006.

Hosokawa et al., "Effect of discharge current and sustained self-sputtering," Proc. 8th Int. Vacuum Congress, Le Vide, Cannes, France, pp. 11-14, 1980'1.

Zabinski et al., Magnetron sputter-pulsed laser deposition system and method, Statutory Invention Registration, US H1933 H, 2001.

International Search Report and Written Opinion for International Application No. PCT/US08/86543 mailed Feb. 25, 2009.

\* cited by examiner

VERY LOW PRESSURE HIGH POWER IMPULSE TRIGGERED MAGNETRON SPUTTERING

CROSS-REFERENCE TO RELATED APPLICATIONS

This application claims priority to PCT application PCT/US2008/086543, filed Dec. 12, 2008, which in turn claims priority to Provisional U.S. Patent Application 61/013,725, filed Dec. 14, 2007, entitled Gasless High Power Pulsed Magnetron Sputtering, and Provisional U.S. Patent Application 61/014,315 filed Dec. 17, 2007, entitled Gasless High Power Pulsed Magnetron Sputtering, all of which applications are incorporated herein by reference, as if fully set forth in their entirety.

STATEMENT OF GOVERNMENTAL SUPPORT

The invention described and claimed herein was made in part utilizing funds supplied by the U.S. Department of Energy under Contract No. DE-AC03-76SF00098, and more recently under DE-AC02-05CH11231. The government has certain rights in this invention.

BACKGROUND OF THE INVENTION

1. Field of the Invention

This invention relates generally to magnetron sputtering, more particularly to high power impulse magnetron sputtering (HIPIMS), and most specifically to a method and apparatus for triggered HIPIMS at very low pressures.

2. Background of the Related Art

Physical vapor deposition, or PVD as it is more commonly known, has become a well known technique for the deposition of thin films. In general, with PVD processes, thin films can be deposited on various substrates by the condensation of a vaporized form of the material. The coating method can involve a purely physical process such as high temperature vacuum evaporation or plasma sputter bombardment of a target, or it may also include, in the case of reactive sputtering, a chemical reaction on the surface of the substrate with the sputtered material. Particular application of this technology is found in the fabrication of semiconductor chips, such as computer microprocessors and RAM chips where PVD is used to deposit thin films of such metals as aluminum and copper. Another application is the deposition of ultrathin films of noble metals such as gold, silver, copper, and platinum, on samples prepared for electron microscope imaging.

In one variation, magnetron sputtering techniques are employed in which a target material made from the metal or other substance to be sputtered is placed into a chamber, along with the substrate to be coated, and the chamber brought to near vacuum. To generate the plasma, a small amount of an inert process gas such as argon is introduced and a negative voltage applied to the target. The voltage can be applied in a continuous (direct current, dc) fashion. In some applications, especially with semiconducting or insulating targets, radio-frequency (RF) power is applied to the target, leading to negative self-bias of the target. Typically, negative voltages such as −300 V to −600 V are applied to the target. While applying the negative voltage, another member proximate the target is maintained at a positive potential relative to the target, thus serving as the anode of the discharge. In most cases the anode is a discrete part of the magnetron, with the process chamber in some cases serving as the anode. When power is applied, the argon gas ionizes and the argon ions attracted to the target, striking the target surface at high speed to dislodge ("sputter") atoms of the target material.

In this sputtering process, secondary electrons are emitted from the target as well, these electrons captured by the magnetic field superimposed upon the target via magnets positioned behind the target. The magnets are commonly incorporated into the target support directly beneath the target to provide an arched magnetic field structure. The electrons, confined to an area adjacent the target, cause ionizing collisions with inert process gases near the target, enhancing the ionization of the plasma and thus further facilitating the sputtering process. In conventional sputtering, the electrons ionize the gas atoms and to a much smaller degree the sputtered atoms. The probability of ionization of those sputtered atoms is low because they leave the target surface typically with several electron-volts of kinetic energy, which corresponds to a high velocity of 1000 m/s or more. Therefore, any bias voltage applied to a substrate is of little effect because the sputtered atoms are electrically neutral.

As features on semiconductors have become smaller and smaller, it has become more important to deposit even thinner films onto the semiconductor substrate, and to obtain films of greater and greater purity, with a density approaching the theoretical limit of bulk density. In one known approach, the magnetron sputtering process is operated at a high power density such that some ions, mostly argon and to a much smaller degree ions of the sputtered material, are available for ion bombardment of a biased substrate. However, increasing the sputtering process power becomes limiting in that the power needed to create the higher density plasmas tends to cause overheating of the target, or even the entire magnetron unit, including its permanent magnets.

To address this problem, resort to the technique known as high power impulse magnetron sputtering (HIPIMS) has been developed. In this approach, power densities of roughly two orders of magnitude greater than those used for magnetron sputtering are employed. Here, a dc voltage is applied to the target for a short period of time, generally in the order of 10 μ and 50 μ seconds, though the pulsed dc voltage could be applied for longer times, such as up to 150 μ seconds, or more. The maximum pulse duty cycle is mainly limited by cooling considerations of the magnetron device. Typically in HIPIMS, the voltage is applied as a square wave with a duty cycle of about 1%. That is, the power is on for only about 1% of the time. With greatly enhanced power densities during the pulse on-time, ionization of sputtered atoms occurs to a much larger extent. By resort to impulse powering of the target, high voltages and high currents can be applied without causing the overheating and the generation of macroparticles typical of arcs.

With HIPIMS, the driving voltages need to be of sufficient amplitude so as to create a condition supportive of self-sputtering of the target material once discharge has been initiated. Thus, according to this technique, peak power densities (at voltages of between 500V and 1500V) of over 100 W cm$^{-2}$ to 5,000 W cm$^{-2}$ are employed. Studies have also shown that densification of the growing film can be achieved by high ion-to-neutral ratios and high ion energy flux arriving at the substrate surface. Combined with deposition of atoms by magnetron sputtering, high flux plasmas are obtainable, leading to superior film properties such as a film density close to bulk material density, a smooth surface topology, and low resistivity.

With the high power densities employed with HIPIMS processing, the likelihood of ionization of sputtered atoms becomes significant. While the degree of ionization of sputtered atoms in conventional magnetron sputtering is only about one percent (1%), it can reach 50% and more with HIPIMS. For copper and silver, for example, ionization of the sputtered atoms approaches 100%. The greatest contribution to ionizing the sputtered material comes from electrons. The magnetized, energetic electrons are trapped by the arched magnetic field and therefore have a long path near the target with a high likelihood of colliding with the sputtered atoms to ionize them. Additionally, a smaller fraction may become ionized via collisions with excited argon. The latter mechanism works because the excited levels of argon have more energy than is needed to ionize sputtered metal atoms (in other words, it works because metals have a lower ionization energy than the energy stored in excited (but neutral) argon atoms.)

Notwithstanding the improvements afforded by HIPIMS, purity of the plasma remains an issue, due in part to the need for the introduction of an inert gas such as argon to both initiate and sustain the plasma. To date, argon has been the gas of choice since it is relatively inexpensive and does not react with the to-be-deposited material. For some applications, however, even with a pure noble gas, traces of the noble gas may find their way into the film coating. The presence of the argon, for example, can act as in impurity, as well as reduce the conductivity of sub-micron copper wires on chips due to argon-induced nano-voids and other defects.

Attempts have been made to address this problem, and in one approach, specific to copper and silver, argon was used to initiate the plasma; the discharge started with argon, but the gas supply turned off after the sputter process has begun, going into a sustained self-sputter mode. See for example, N. Hosokawa, T. Tsukada, and H. Kitahara, *Effect of Discharge Current and Sustained Self Sputtering*, Proc. 8$^{th}$ Int. Vacuum Congress, le Vide, Cannes, Frances, 1980, pp. 11-14, and W. M. Posadowski, Vacuum 46, 1017 (1995). While this approach can reduce the amount of gas captured by the deposited film, it does not eliminate it.

SUMMARY OF THE INVENTION

According to one aspect of the invention which will be hereinafter described with reference to the various drawings and detailed description to follow, a HIPIMS method and apparatus is provided which eliminate the need for the presence of an inert gas to initiate and/or sustain the plasma formation. This is achieved by "gasless" magnetron sputtering, which results in films of the highest purity. In another aspect of the invention, where an inert gas may be present, the amount is limited such that the mean free path of the sputtered target material is greater than the distance between the target and the substrate to be coated. In this mode of operation, the sputtered material reaches the substrate at its highest energy potential, producing a denser film of high purity.

In both cases, with very low process pressures, generally in the range of between $8 \times 10^{-4}$ to $10^{-11}$ Torr, a sustaining plasma is achieved with the aid of a triggering plasma proximate the target. In one embodiment the triggering plasma is initiated using a cathodic arc source positioned next to the target face. Several alternative embodiments of the cathodic arc source are described hereinafter in the Detailed Description of the Invention.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1A:
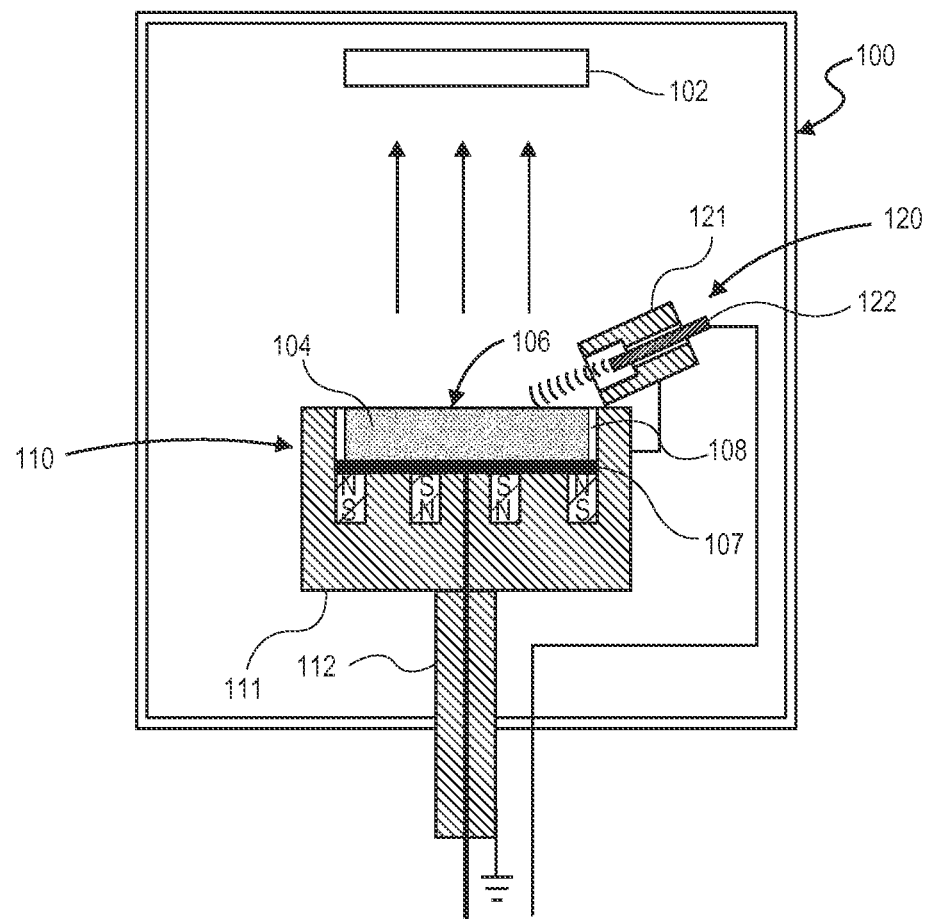
FIG. 1A is a schematic side elevation of an HIPIMS chamber including a miniature cathodic arc source according to one aspect of this invention.

By way of this invention, a method and apparatus are provided for HIPIMS processing in which sputtering can be initiated either without the need of an inert process gas, or in the presence of very small amounts of inert gas, plasma initiation achieved by way of a triggering plasma. The triggering plasma, comprising a small amount of preferably the same material as that of the target material, is generated in an area proximate the target surface. In some cases, the triggering plasma may be comprised of another material than the target material, and this could be used to introduce a controlled amount of dopant to the film produced.

Traditionally, magnetron sputtering has been carried out at low process pressures such as $10^{-2}$ to $10^{-3}$ torr, commonly using argon as an inert process gas to assist in the formation of a plasma to initiate target sputtering. In these processes, the deposition chambers are first pumped down to a base pressure, typically in the range of $10^{-6}$ to $10^{-8}$ Torr before introduction of the sputtering process gas. With the introduction of the process gas, the pressure within the chamber rises to $10^{-2}$ to $10^{-3}$ Torr. However, even at these low process pressures, the small amounts of argon present can become entrapped in the deposited film. Further, collisions between sputtered atoms/ions from the target and argon atoms both deflects the sputtered material and reduces its kinetic energy, thus reducing both the directionality of the sputtered atoms and ions, and the achievable density of the sputtered films.

Ideally, to eliminate such contamination, sputtering should be carried out in a gasless environment, generally considered to be at pressures ranging from $10^{-6}$ to $10^{-8}$ Torr and below. However, with conventional approaches, at these low pressures, plasma initiation is not possible. None the less, by the HIPIMS methods and apparatus of this invention, such very low pressure high impulse power magnetron sputtering may be realized by employing a pulsed cathodic arc to generate a triggering plasma proximate to the target.

For some target materials, operation at such low pressures, even with a triggering plasma may not be sufficient to create a sustaining plasma. Thus, process pressures above these levels may be necessary to achieve sustainable magnetron discharge. According to an embodiment of this invention, desirable results may still be obtainable provided operating pressures are sufficiently low such that the mean free path of a sputtered target atom in the sputtering chamber exceeds the distance between the target and the substrate. In such a low pressure environment, the sputtered atoms/ions will strike the substrate without having first collided with an argon atom or other residual gas atom. At the pressures generally required to achieve this condition, ranging between $8\times10^{-4}$ to $10^{-5}$ Torr, it has been found that initiation of a plasma will not occur, even under a high power impulse sputtering regime without the use of a triggering plasma according to the methods and apparatus of this invention. In this way it is possible to successfully operate in a reduced gas atmosphere at pressures ranging of from approximately $10^{-4}$ to $10^{-5}$ Torr, one to two orders of magnitude lower than currently achievable.

In the processes of this invention, the chamber in which the target and substrate are placed is first pumped down to the desired base pressure and then the inert process gas (when needed) is introduced until operational pressures are reached. Typically, the process can be run at pressures ranging from $8\times10^{-4}$ to $10^{-5}$ Torr, to near complete (gasless) vacuum pressures ranging from $10^{-6}$ to $10^{-8}$ Torr. Using vacuum pumps and chamber seals capable of sustaining ultrahigh vacuum, the chamber can be pumped down to even higher vacuum levels such as $10^{-10}$ to $10^{-11}$ Torr, and more.

With vacuum achieved, the target can be pulsed, the sputtering process initiated by a triggering pulsed plasma plume that floods the target. In one embodiment, a miniature cathodic arc plasma source is used to produce said triggering plasma plume, and in one exemplary embodiment the cathode material used in the separate cathodic arc plasma source is comprised of the same material as that of the target. The arc cathode in one exemplary embodiment is in the form of a rod. In an embodiment, arc discharge can be achieved by providing a pulsed dc voltage to the rod. In another embodiment, the triggering plasma plume can be achieved by focusing a pulsed high power laser onto a laser ablation target. In a preferred embodiment, the laser ablation target is of the same material as the sputtering target. Other options with respect to the miniature arc plasma sources are further described below with reference to the figures.

The conditions for sustained self sputtering can be achieved for a material where the condition $\alpha\beta\gamma_{ss}\geq1$ is met, where $\alpha$ is the ionization probability for a sputtered atom, $\beta$ is the probability that a sputtered and ionized atom will return to the target, and $\gamma_{ss}$ is the self sputter yield, which is defined as the ratio of the number of sputtered atoms to the number of incident ions. To start the process there must be sufficient initial ion generation for sputtering to occur. Because $\alpha<1$ and $\beta<1$, the condition $\gamma_{ss}>1$ is a necessary but not a sufficient condition for sustained self-sputtering. To satisfy the condition $\alpha\beta\gamma_{ss}\geq1$, also important is the secondary electron emission yield, magnetic confinement of secondary electrons, and their ability to ionize the target atoms. Once the self-sputter mode has been initiated, it may become self-sustaining in the sense that no added gas is required. Rather, the ionized sputtered material assumes the function of the conventional inert gas. Notably, in the absence of a process gas, the sustained sputter process only operates when the sputter material is ionized, a condition requiring the very high power densities of HIPIMS, which are typically in the order of one hundred to several hundred watts/cm$^2$, or more.

Figure 1B:
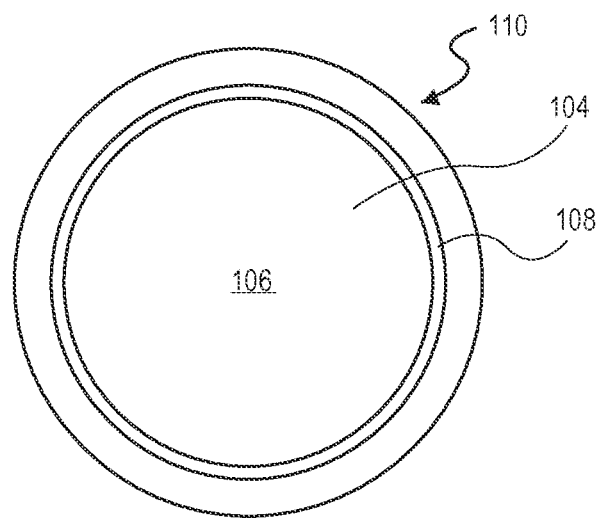
FIG. 1B is a top down view of the target and pedestal of the chamber.

With reference now to FIG. 1, an embodiment of the invention is depicted in which a chamber 100 is shown, a substrate 102 to be film coated secured at the top of the chamber by a holding mechanism (such as a vacuum chuck in the case of a silicon wafer) and spaced a distance from the target material 104, which is mounted to a magnetron positioned at the bottom of the chamber. The orientation of the magnetron is for illustration purposes only. Its operation does not depend upon orientation, i.e. it could be mounted to the side wall, or the lid of the chamber. The substrate may be sustained at ground potential, but it is preferably biased negatively with respect to the plasma potential in order to attract and accelerate ions from the plasma. The power brought to the substrate by the accelerated ions will cause heating of the substrate, which may be desirable for the film properties, but in other circumstances substrate cooling may be desired to control and limit substrate temperature rise. The bias amplitude should be selected carefully since excessive bias can lead to undesirable sputtering from the substrate, thereby reducing the deposition rate.

While the target does not need to be of the same size as the substrate to be coated, in many applications the target will be the same size or larger than the substrate in order to obtain a uniform coating. Alternatively, where the substrate is larger than the target (not shown), the substrate may be moved laterally relative to the target such that all areas become evenly coated. The target is isolated from its anode support stage 110 by insulator 107 and a gap 108 such that the sputtering is limited to the exposed face 106 of target 104, and most intensely where the magnetic field vector is parallel to the target surface plane, which causes the so-called "racetrack" to appear: a zone of most intense sputtering. Anode support stage 110 includes platform 111 which is connected to stem 112 to support and position target 104 within chamber 100. Stage 110 is maintained at ground or at a positive voltage relative to the target, thus serving as the anode for the discharge system. The support stage 110 may be movable (mechanism not shown) to allow for adjustment of the distance within the chamber between the target and the substrate. Exemplary distances for a substrate such as a typical wafer positioned above a target can vary anywhere from 3 cm to 30 cm.

Stage 110 may be formed of aluminum metal or stainless steel. Multiple magnets (typically permanent magnets) 114 incorporated into stage 110 are positioned behind the target, with their North and South poles aligned such that an arched magnetic field appears above the target surface. In case of a planar magnetron, i.e., a magnetron with a thin disk or plate target, the arched field will confine the electrons and define a zone of denser plasma that causes the "racetrack" pattern on the target to appear. Other geometries of a magnetron may be employed, for example a cylindrical magnetron. In any case, the presence of the magnets facilitates confinement of electrons and ionization of the sputtered target atoms. The presence of the magnetic field facilitates the existence of an electric field in the plasma so that positive ions are attracted to the negative target.

Ignition of the magnetron discharge is provided by a plasma plume coming, in one embodiment, from miniature cathodic arc source 120, shown in FIG. 1 spaced from stage 110, but in electrical connection therewith so as to be at the same potential. The arc source includes a housing (arc anode) 121, which can be formed of the same material as the stage 110, the anode of the magnetron. Arc cathode 122 is provided within housing 121, one end of which is exposed to the face 106 of target 104. The arc cathode 122 of the arc source is preferably made of the same material as the target and may be provided in the form of a rod. The rod at its other end is connected to a source of power such as a charged capacitor or pulse-forming-network. This is a pulsed dc source which can provide pulsed power with an open circuit voltage of several hundred volts. A relatively high open-circuit voltage can be used to provide a simple means of initiating the arc discharge, such as the circuits disclosed at FIGS. 9A, 9D and 9E of U.S. Pat. No. 6,465,793, which patent is incorporated herein by reference. Exemplary of a suitable power supply is described in the article by A. Anders, R. A. MacGill, and T. A. McVeigh,

*Efficient, compact power supply for repetitively pulsed, "triggerless" cathodic arcs*, Rev. Sci. Instrum., vol. 70, pp. 4532-4534, 1999, which is incorporated herein by reference. Using such a power source, for each pulse, arc discharge can be initiated at high voltages such as up to 1000V, and during the same pulse dropped down to a much lower burning voltage.

Impulse power to the target is supplied directly using a separate switched dc power source. The power source should be capable of providing pulsed dc voltages of 500V to 1500V or more, at intervals with a desired duty cycle. Typical power pulses have a repetition frequency in the order of 5 to 500 Hz, with a peak power density of up to 5 kW/cm$^2$ averaged over the whole of the target area. The power supply can be selected from any number commercially available, so long as they can deliver pulses of sufficient voltage and current to drive the sputtering and ionization processes. Because of the low duty cycle, the applied power density can reach very high values of up to 10 kW/cm$^2$.

To carry out a coating cycle a substrate such as a wafer is inserted into the chamber in which a target material is already in place. The chamber is sealed and pumped down to high vacuum ($10^{-6}$ to $10^{-8}$ Torr) using, for example, a cryogenic or turbo molecular pump (not shown). Exemplary for a metal such as copper where the presence of an inert process gas is not required for plasma formation, a negative pulsed voltage (i.e. a target pulse) is applied to the target, the power is applied in a synchronous manner with the pulsed power applied to the cathodic arc source to generate the triggering plasma. The cathodic arc power source can be a short-pulse pulse-forming network, or simply a well-dimensioned capacitor. To initiate the magnetron sputtering plasma, the cathodic arc source power pulse in one embodiment is timed to coincide with the beginning of the voltage pulse to the target. Arc plasma triggering and sputter deposition pulses are repeated until the deposition process is completed, i.e. the desired film thickness on the substrate has been obtained. During the off phase of the pulse duty cycle, plasma generation turns completely off, sputtering ceasing between pulses.

In an exemplary deposition sequence, the dc sputtering pulse is turned on first. In this state the system is essentially in standby mode for a few microseconds. Thereafter the triggering plasma arc source is pulsed for about 10-20 microseconds to initiate the sputtering plasma. With the arc pulse complete, the target pulse (i.e. the pulse to the target) is continued for the remainder of the deposition cycle, about another 30-1000 microseconds or so. Thereafter, during the off-phase of the duty cycle, the system is allowed to cool, and the power supply recharged. In another exemplary mode, the triggering arc pulse is extended for a period of time up to the duration of the target pulse, to further assist with plasma formation. In yet another exemplary mode, the order of pulse initiation can be reversed, with cathodic arc pulse started first, the sputtering pulse to the target then applied, and continued for the cycle duration, the arc pulse having ended after 10-20 microseconds.

An example of a target material requiring very small amounts of an inert process gas for plasma formation is ultra-pure niobium (Nb). Using power settings similar to those used with copper, at the same vacuum pressures it was not possible to initiate a self-sustained self-sputtering plasma, even with the assist of a triggering plasma from the cathodic arc source. However, introducing very small amounts of an inert process gas such as argon, such that process pressures were kept below $8 \times 10^{-4}$ Torr, a HIPIMS plasma consisting mostly of niobium was initiated. In this mode, the chamber was continuously pumped while at the same time a small but continuous stream of argon gas was supplied. By operating at these reduced pressures, but still above the "gasless" range, a large portion of the sputtered niobium atoms are ionized, and atoms and ions of higher energy reach the substrate, which in turn leads to higher density films.

To still further increase the density of the sputter deposited film, the substrate can be negatively biased. The ions of the plasma will be accelerated by the electric field in the sheath between substrate and plasma. The energy gained can be represented by the formula E=Q e V where E is the product of Q times e times V, Q being the ion charge state number, which is typically 1 but may also have values of 2 and even 3, e being the elementary charge $1.6 \times 10^{-19}$ As, and V being the bias voltage of the substrate relative to the plasma potential. For example, at a bias voltage of 100 V, singly charged ions gain an extra 100 eV before impact on the substrate surface. By way of background, a discussion regarding biased-generated processes can be found in the paper by A. Anders entitled *Fundamentals of pulsed plasmas for materials processing*, Surf. Coat. Technol., vol. 183, pp. 301-311, 2004, which article is incorporated herein by reference. In bias mode, not only are denser films formed, but, in the case of polycrystalline films like niobium, more oriented ("textured") films are formed as well, the film minimizing its free energy taking into account surface energy and strain energy The formation of dense, smooth, and textured films is beneficial for many applications, for example for those minimizing electrical sheet resistance.

EXAMPLE

The following experiment is presented as an illustration of a process for copper coating according to the invention, and is not intended to be limiting in any way. In this experiment, a 2-inch copper target is mounted on a standard commercial magnetron (US Inc.) and connected to a commercial pulsed power supply (SPIK2000A by Melee GmbH), having a maximum voltage of 1000 V and a maximum peak power of 100 kW (implying a maximum peak current of 100 A). The magnetron is water cooled with a nominal average power limit set to 1 kW due to cooling limitations of the magnetron. The anode is made from aluminum. A miniature plasma source of a ¼ inch copper cathode rod, i.e. a "minigun" type source (see R. A. MacGill, M. R. Dickinson, A. Anders, O. R. Monteiro, and I. G. Brown, Rev. Sci. Instrum. 69, 801 (1998)), is placed next to the magnetron sputtering source such that the cathodic arc plasma plumes towards the target surface, blanketing the surface with metal plasma of the same copper material. Using a non commercial unit as described in the previously identified article *Efficient, compact power supply for repetitively pulsed, "triggerless" cathodic arcs*, the arc source power supply is set up to deliver a short (20 µs) pulse having an initial charging voltage of 800 V, the voltage dropping during the pulse to a burning voltage of 20 volts, at a current of about 200 amps. Practically simultaneously, the SPIK2000A applies a voltage greater than 530 Volt to the target. The magnetron discharge kicks in when both initiating arc plasma and driving voltage from the SPIK pulser are present. Initially, the magnetron discharge is not self-sustained because of the assistance of the arc plasma. However, on the time scale of about 10 µs, the arc plasma is no longer needed because the sputtering discharge is sufficiently intense to create the conditions necessary for sustained self-sputtering. For example, the discharge of the magnetron can operate with pulses of 500 µs and a repetition rate of 20 pulses per second.

Figure 2A:
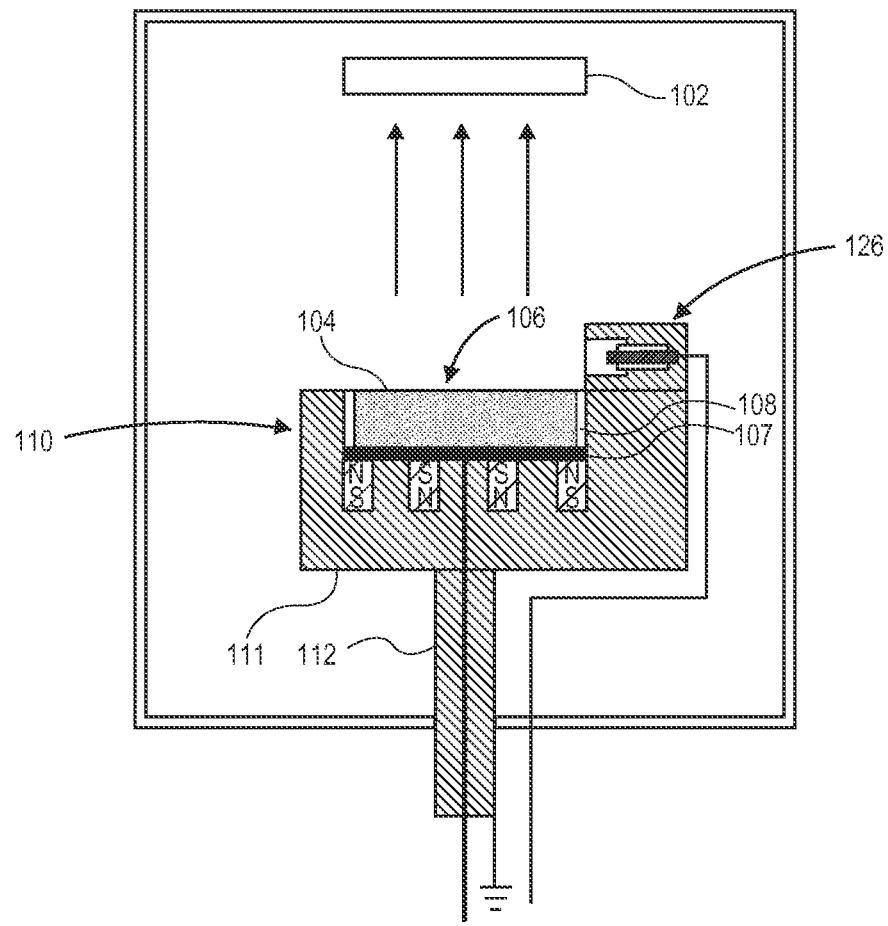
FIG. 2A is a schematic side view of the chamber of FIG. 1 showing an alternative embodiment of the invention.
Figure 2B:
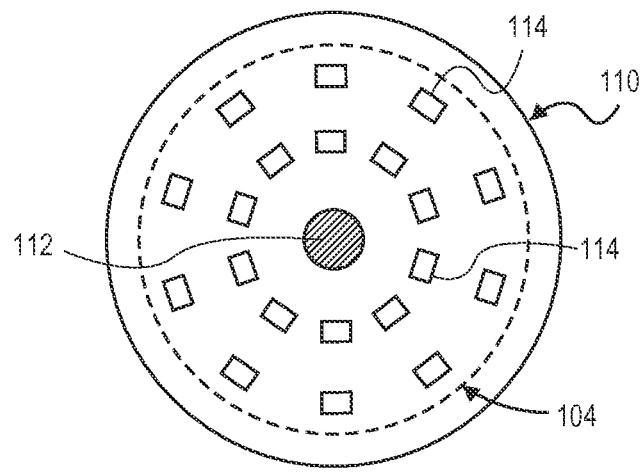
FIG. 2B is a bottoms-up view of the underside of the pedestal of FIGS. 1A and 2A illustrating a typical magnet array.
Figure 3:
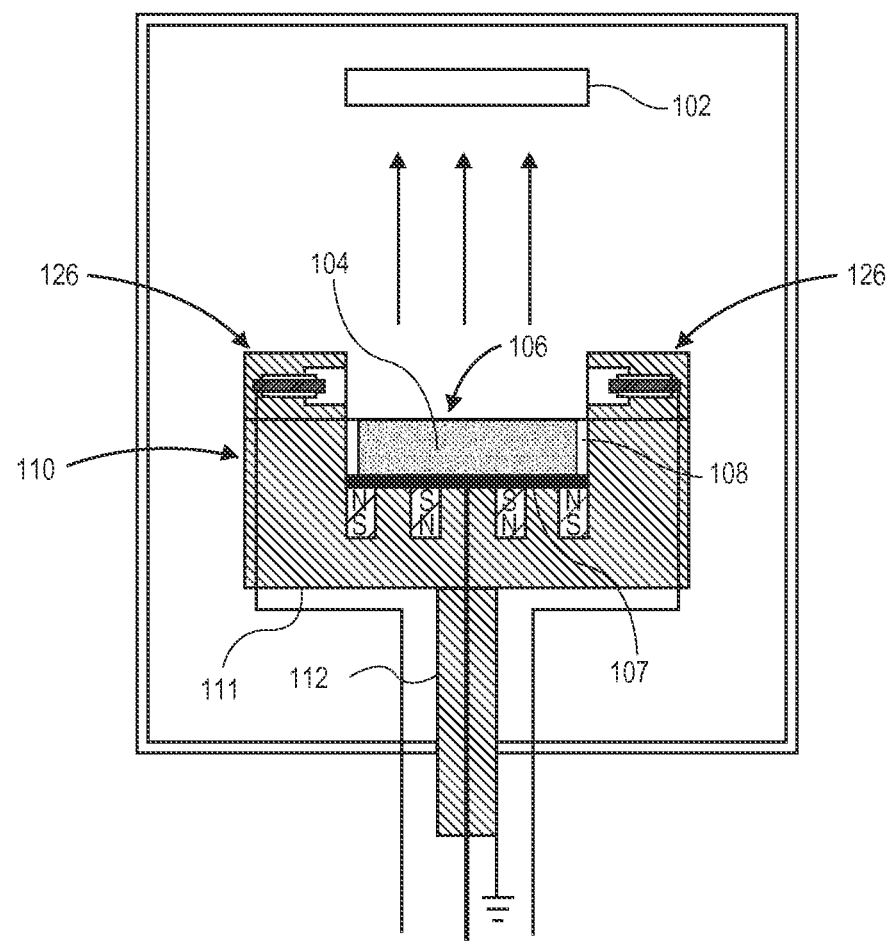
FIG. 3 is a schematic diagram of the chamber of FIG. 1 illustrating yet another embodiment of the invention, including two miniature cathodic arc sources.

Variations in the cathodic arc source triggering device will now be discussed with reference to FIGS. 2-5. With reference first to FIG. 2, the chamber of FIG. 1 is depicted wherein the cathodic arc source 126 is formed integral to the stage 110, and not only made of the same material but in fact integrated as one unit. In other respects the arc source is the same. In this embodiment power to the arc cathode can be supplied through platform 111. In FIG. 3, two opposing arc sources 126 are shown, each arc source powered by its own power source. The second source, or a third or forth for that matter, can ensure an overall greater lifetime of the system. In case one cathodic arc source fails to operate, the user can simply switch to another one. The operation of the sources is the same as for source 120 discussed in connection with FIG. 1.

Figure 4:
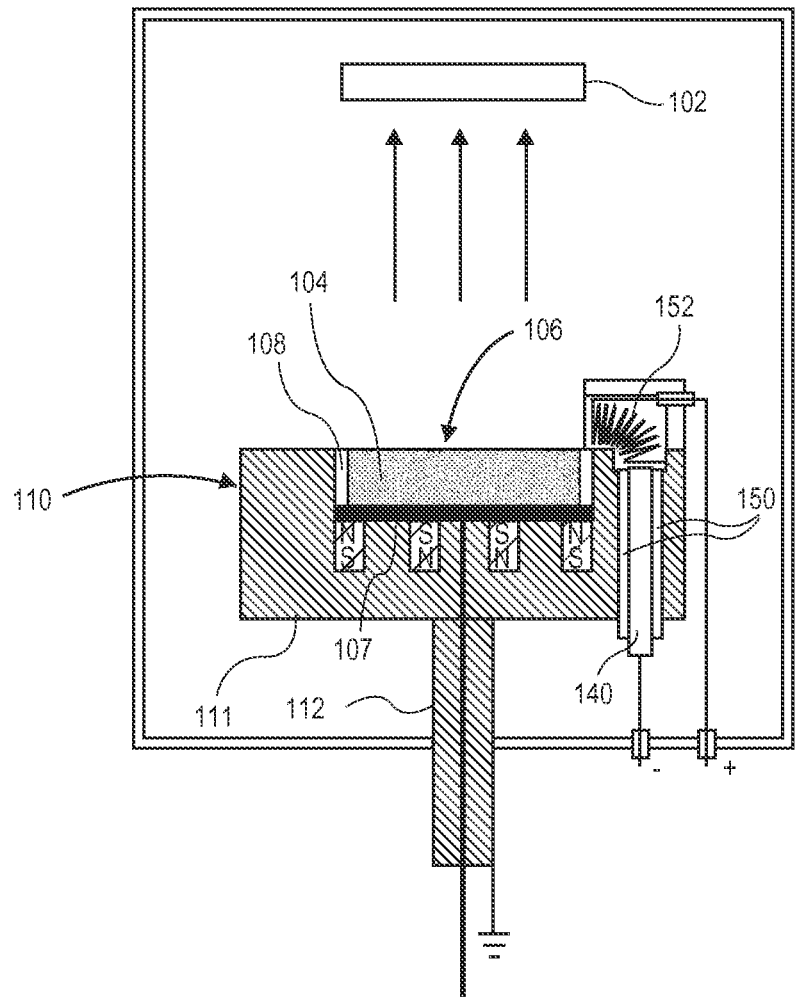
FIG. 4 is a schematic diagram of the chamber of FIG. 1 illustrating yet another embodiment of the invention, wherein a filtered miniature cathode arc source is depicted.

In FIG. 4, a variation of the miniature cathodic arc source is shown. Here the plasma plume is filtered, that is, freed from deleterious so-called macroparticles that commonly contaminate a cathodic arc plasma. The filtered source includes a cathode rod 140, an insulator 150 that separates the cathode rod from the anode body (stage 110), and a curved coil 152 which in its simplest presentation is a coil made from thick bar copper wire, not unlike a "slinky". One end of the "slinky" is connected to the anode body (usually at ground and electrically connected to the anode member of the magnetron). The other end of the slinky is connected to a pulsed arc power supply. One may either use the same arc power supply to drive both the arc cathode and the coil, or more preferably use a separate (third) power supply to provide current to the filter coil. The filter effect is based on the fact that the plasma can be guided or "bent" by the magnetic field of the coil, whereby the heavier macroparticles move essentially along a straight path. The macroparticles either stick to the filter turns, the enclosing walls of the arc source housing, or fall back to the source region and come to rest. The use of such filtered sources is further described in the paper *Approaches to Rid Cathodic Arc Plasma of Macro and Nanoparticles: a Review*, A. Anders, Surf. Coat. Technol., vol. 120-121, pp. 319-330, 1999, which paper is incorporated herein by reference. This embodiment is particularly suitable to situations where substrate contamination by macroparticles from the short cathodic arc initiation plasma is of concern.

Figure 5:
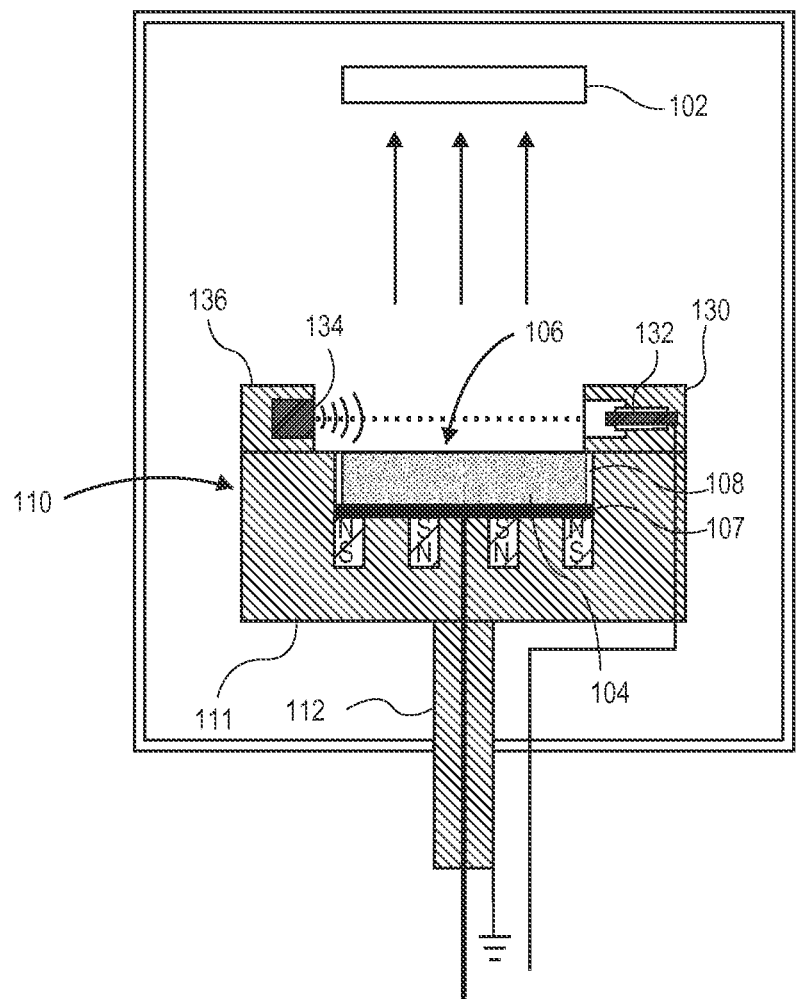
FIG. 5 is a schematic diagram of the chamber of FIG. 1 illustrating yet another embodiment of the invention in which a pulsed laser is directed to an ablation target to produce a triggering plasma plume that enables the onset of the magnetron discharge.

Finally in FIG. 5, yet another form of a pulsed plasma source is depicted comprising two components, a pulsed laser 132 and an ablation target 134 formed of the same material as the magnetron target. Laser 132 is encased in housing 130 which is integral to stage 110 and may be formed of the same material. In order to obtain laser ablation and plasma formation, the laser should be capable of providing a focused laser spot having a power density that exceeds about $10^{11}$ Watt/m$^2$. Housing 130 includes an opening exposing the output opening of laser 132. The laser target 134, made of the same material as the magnetron target, is contained within a housing 136 which is positioned opposite laser 132 such that when laser 132 is pulsed, the issuing laser beam will ablate the laser target material 134 to create a plume of plasma from the laser target. The plume then spreads over the magnetron target and initiates the magnetron discharge, much as is the case with the pulsed arc source.

The illustrated example was presented in the context of deposition of a copper film on a wafer. However, the apparatus and processes of this invention may equally be used on flat or slightly curved objects, such as curved glass, typically used in the fabrication of automotive windows, as well as on other substrates such as silver on glass for highly reflective mirrors. Another exemplary use is metallization of webs, which are large rolls of thin plastic sheets typically used in food packaging, for example. Metals other than copper, silver, and niobium as heretofore described may also be sputter deposited by this HIPIMS method, including such metals as aluminum, titanium, tungsten, nickel, bismuth, chromium, and the like.

It has been found that in some cases it is beneficial to select short HIPIMS pulses, of a duration less than 100 microseconds, and preferably less than 50 microseconds, to allow for usage of relatively high pulse repetition rates while observing the limits of maximum average power. This leads to improved triggering of the successor pulse facilitated by the afterglow or "left-over" plasma from the previous pulse. Surprisingly, this "afterglow" assistance can be used to repetition rates as low as about 100 Hz, i.e. much lower rates than one would expect from the known plasma decay rates.

To those skilled in the art it is clear that the here-described triggered operation of HIPIMS can be done not just in the high vacuum artificially produced in vacuum chambers but in the natural vacuum of space. Triggered sputtering in space can be utilized for producing coatings in space, or, by utilizing the high flux of fast, energetic atoms and ions, for space propulsion.

It is to be appreciated by one of skill in the art, that the apparatus and methods disclosed herein will have application in a number of other contexts. For example, while the use of a filtered arc source of the same material as the target eliminates contamination of the deposited film, in one embodiment, one could use an arc source composed of a different cathode material if one wished to dope the deposited film with the material of the arc source.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:
1. A method comprising:
    (a) placing a substrate in a chamber housing a target and a cathodic arc plasma source positioned proximate the target;
    (b) evacuating the chamber to a vacuum pressure and maintaining the vacuum pressure without admitting an inert gas to the chamber during operations (c), (d), and (e);
    (c) applying a target pulse of a negative voltage to the target for a first time period while maintaining a member proximate the target at positive potential relative to the target, the member serving as an anode of a discharge, the target pulse being of sufficient amplitude so as to create a condition supportive of self-sputtering of the target after sputtering has been initiated;
    (d) applying a triggering pulse for a second time period to the cathodic arc plasma source to generate a triggering plasma comprising material from the cathodic arc plasma source which blankets the target to initiate sputtering of the target, the first time period and the second time period overlapping for at least a portion of the time periods; and
    (e) repeating operations (c) and (d) to deposit material from the target onto the substrate.

2. The method of claim 1 wherein the vacuum pressure is between $10^{-6}$ Torr and $10^{-8}$ Torr.

3. The method of claim 1 wherein the target is selected from the group consisting of silver, copper, nickel, and bismuth.

4. The method of claim 1 wherein the target pulse is in the range of 500V to 1500V.

5. The method of claim 4 wherein the target pulse is of sufficient amplitude so as to result in a power density to the target of at least 100 W cm$^{-2}$.

6. The method of claim 4 wherein the target pulse is of sufficient amplitude so as to result in a power density to the target of between 100 W cm$^{-2}$ to 5,000 W cm$^{-2}$.

7. The method of claim 1 wherein the vacuum pressure is at or below 8×10$^{-4}$ Torr.

8. The method of claim 1 wherein the target is selected from the group consisting of niobium, aluminum, titanium, tungsten and chromium.

9. The method of claim 1 wherein the first time period is longer than the second time period.

10. The method of claim 9 wherein the target pulse is applied before applying the triggering pulse.

11. The method of claim 9 wherein the target pulse is applied after applying the triggering pulse.

12. The method of claim 1 wherein the substrate is negatively biased with respect to a plasma potential.

\* \* \* \* \*